United States Patent [19]

Fujimaki

[11] Patent Number: 5,155,434
[45] Date of Patent: Oct. 13, 1992

[54] SUPERCONDUCTING GUANTUM INTERFERENCE MAGNETOMETER HAVING A PLURALITY OF GATED CHANNELS

[75] Inventor: Norio Fujimaki, Atsugi, Japan
[73] Assignee: Fujitsu Limited, Kanagawa, Japan
[21] Appl. No.: 633,340
[22] Filed: Dec. 26, 1990

[30] Foreign Application Priority Data

Dec. 26, 1989 [JP] Japan .................................. 1-340964

[51] Int. Cl.$^5$ .......................................... G01R 33/035
[52] U.S. Cl. ..................... 324/248; 505/846
[58] Field of Search ................. 324/244, 301, 248; 505/842–846; 307/306

[56] References Cited

U.S. PATENT DOCUMENTS 4,489,274 12/1984 Berlincourt ........................ 324/248
4,663,590 5/1987 Gershenson et al. ............... 324/248

FOREIGN PATENT DOCUMENTS 185464 7/1989 Japan ................................... 324/248

Primary Examiner—Kenneth A. Wieder
Assistant Examiner—Warren S. Elmonds
Attorney, Agent, or Firm—Staas & Halsey

[57] ABSTRACT

A plurality of superconducting quantum interference magnetometers are provided corresponding to a plurality of channels. Each of the superconducting quantum interference magnetometers is accommodated in a cooling vessel and has a superconducting detection loop for interlinking with the unknown magnetic flux. A superconducting magnetic sensor is magnetically coupled to the superconducting detection loop for producing an output voltage pulse. A feedback circuit, supplied with the output voltage pulse from the superconducting magnetic sensor, produces a magnetic flux that counteracts the unknown magnetic flux in response to each output voltage pulse. A gate circuit is provided between the superconducting magnetic sensor and the feedback means for controlling the supplying of the output voltage pulse from the superconducting magnetic sensor to the feedback circuit. The gate circuit is supplied with a control signal and selectively passes the output voltage pulse in response to a logic level of the control signal. Further, a selection circuit provided in the cooling vessel to selectively provide the control signal to the gate circuit in response to a selection signal.

14 Claims, 9 Drawing Sheets

SUPERCONDUCTING QUANTUM INTERFERENCE MAGNETOMETER HAVING A PLURALITY OF GATED CHANNELS

BACKGROUND OF THE INVENTION

The present invention generally relates to superconducting quantum interference magnetometers that utilize digital superconducting quantum interference devices for the measurement of feeble magnetic fields, and more particularly to a superconducting quantum interference magnetometer equipped with a plurality of measuring channels.

Superconducting quantum interference magnetometers that utilize the superconducting interference devices abbreviated hereinafter as SQUIDs are used as the essential device for measuring the extremely feeble magnetic fields produced by the biologic bodies and organs such as brain or heart. Particularly, there is a keen demand for a magnetometer equipped with a plurality of measuring channels for measuring the distribution of magnetic field in a short time.

In such multi-channel SQUID magnetometers, a number of digital SQUID sensors are arranged parallel with each other, wherein each SQUID sensor produces a series of output voltage pulses in response to the unknown magnetic flux that interlinks with a superconducting detection loop of the SQUID sensor. In combination with each SQUID sensor, there is provided a corresponding feedback circuit that produces a counteracting feedback magnetic flux in the detection loop such that the unknown magnetic flux is counteracted by the feedback magnetic flux. The magnitude of this feedback magnetic flux is increased stepwise in response to each output voltage pulse of the SQUID sensor until the unknown magnetic flux is totally canceled out. Upon the cancellation of the magnetic flux, the induction current induced in the superconducting detection loop disappears and the SQUID sensor stops producing the output voltage pulses. The measurement of the magnetic flux is achieved by counting the number of output voltage pulses thus produced by the SQUID sensor. On the other hand, the direction of the magnetic flux is determined by detecting the polarity of the voltage pulse. Such a SQUID magnetometer using the digital SQUID sensor provides various preferable features such as increased S/N ratio, easiness in processing the output data by digital processing systems, and the like. The inventor of the present invention has previously proposed such a digital SQUID magnetometer wherein the SQUID sensor and the feedback circuit are assembled into a single chip in the U.S. Pat. No. 4,947,118, which is incorporated herein as reference. Such a so-called single chip SQUID magnetometer incorporates both the SQUID sensor and the feedback circuit in the liquid helium bath and thus eliminates the feedback conductor extending between the SQUID sensor in the liquid helium bath and the feedback circuit provided conventionally in the room temperature environment. Thereby, the problem of penetration of heat from the room temperature environment to the liquid helium bath through the feedback conductor is eliminated and the consumption or evaporation of the liquid helium used for maintaining the SQUID device at the superconducting state, is significantly reduced.

In constructing a multi-channel magnetometer using such a digital SQUID sensor, there is an obvious approach shown in FIG. 1, wherein a number of single chip SQUID magnetometers, each comprising a SQUID sensor such as the sensor $1a$–$1n$, a corresponding feedback circuit such as the circuit $2a$–$2n$, and a feedback path such as the path $3a$–$3n$, are provided parallel with each other and connected to a processing and display unit 5 for digital processing of the output pulses and display of the result of measurement. Thus, the processing and display unit 5 receives the output voltage pulses of the SQUID magnetometers through a parallel output conductors $4a$–$4n$ when there are n such magnetometer channels.

In the construction of FIG. 1, it should be noted that the parallel conductors $4a$–$4n$ extend from the processing unit 5 operated at the room temperature to the SQUID magnetometers operated at the liquid helium temperature. In other words, the conductors $4a$–$4n$ extend across a wall of a liquid helium container in which the SQUID magnetometers are contained. Thereby, there arises a problem of heat penetrating into the liquid helium through these conductors. It should be noted that the number of conductors $4a$–$4n$ corresponds to the number of the channels. With increasing number of channels, this effect of penetration of heat and the associated problem of excessive consumption of liquid helium becomes a serious problem in the actual use of the SQUID magnetometer.

On the other hand, there is another known construction of multi-channel SQUID magnetometer as shown in FIG. 2, wherein the output of the SQUID sensors $1a$–$1n$ are sent to a multiplexer 11 provided in the room temperature system for a time-divisional multiplexing. The output of the multiplexer 11 is supplied to a feedback circuit 12 also operated in the room temperature system, and the feedback signal produced by the feedback circuit 12 is once stored in a memory 13 for each channel under control of a controller 15. Further, the feedback signal is fed back to the SQUID sensors $1a$–$1n$ from the memory 13 via feedback conductors $14a$–$14n$. The memory 13 further supplies the feedback signal representing the detected polarity and magnitude of the magnetic flux to a processing unit 17 for processing and displaying the result of measurement.

In this apparatus, too, the problem of penetration of the heat is not eliminated. Particularly, as there are n additional conductor strips connecting the SQUID sensors and the multiplexer 11, the problem of evaporation of liquid helium is deteriorated rather than improved. Even when one could design the multiplexer 11 by using a Josephson device and thus succeeded in providing the multiplexer 11 in the liquid helium bath together with the SQUID sensors $1a$–$1n$, the problem of penetration of heat through the feedback conductors $14a$–$14n$ remains unsolved.

SUMMARY OF THE INVENTION

Accordingly, it is a general object of the present invention to provide a novel and useful multi-channel SQUID magnetometer wherein the foregoing problems are eliminated.

Another and more specific object of the present invention is to provide a multi-channel SQUID magnetometer wherein the penetration of heat into a cooling vessel holding the SQUID magnetometers of each channel at the superconducting state is minimized.

Another object of the present invention is to provide a multi-channel SQUID magnetometer wherein the number of conductor strips that connect SQUID sensors located in a low temperature vessel to external circuits outside the low temperature vessel is decreased.

Another object of the present invention is to provide a multi-channel magnetometer, comprising: a cooling vessel for holding a cooling medium; a plurality of SQUID magnetometers provided in correspondence to the plurality of channels, each of the SQUID magnetometers being accommodated in said cooling vessel so as to be cooled by the cooling medium and comprising a superconducting detection loop for interlinking with an unknown magnetic flux, a digital SQUID sensor coupled magnetically to the superconducting detection loop for producing an output voltage pulse in response to the interlinking of the superconducting detection loop with the unknown magnetic flux, feedback means supplied with the output voltage pulse from the digital SQUID sensor for producing a magnetic flux that counteracts the unknown magnetic flux in response to each output voltage pulse, and gate means provided between the digital SQUID sensor and the feedback means for controlling the supplying of the output voltage pulse from the digital SQUID sensor to the feedback means, said gate means being supplied with a control signal and selectively passing the output voltage pulse in response to a logic level of the control signal; selection means provided in said cooling vessel so as to be cooled by the cooling medium, said selection means being supplied with selection signals specifying a desired channel and supplying the control signal selectively to the gate means in the SQUID magnetometer of the specified channel; and connection lead means connected to each digital SQUID sensor of the SQUID magnetometers of the plurality of channels via the corresponding gate means for leading the output voltage pulses to an external processing circuit provided outside the cooling vessel.

According to the present invention, the selection means selects the SQUID magnetometers consecutively, and the output pulse of the digital SQUID sensor in the selected SQUID magnetometer is outputted to the external processing circuit consecutively or time-sequentially. Thereby, only one connection lead is necessary in the connection lead means for outputting the output voltage pulse to the outside of the cooling vessel and the penetration of the heat into the cooling vessel through the connection lead is minimized. In the SQUID magnetometer used in the present multi-channel magnetometer, it should be noted that both the digital SQUID sensor and the feedback means are accommodated in the cooling vessel. Thus, the problem of penetration of heat through the feedback conductor does not occur.

In another aspect, the present invention provides a desirable feature in that the penetration of heat through control leads that are used to supply the selection signal to the selection means is minimized, as the possible number of selection is given by the combination of the selection signals that is much larger than the number of control leads necessary for supplying the selection signals. Thereby, the number of control leads to the selection means can be reduced with respect to the predetermined number of channels and the foregoing preferable feature of minimization of the penetration of heat is achieved.

In a further aspect, the present invention has an important feature that the gate means is provided between the SQUID sensor the feedback means. Thereby, the supply of the output voltage pulses from the SQUID sensor to the feedback means is interrupted during when the SQUID magnetometer is not selected and the operation of the SQUID magnetometer is stopped. In other words, the SQUID magnetometer of each channel holds its state when not selected and resumes operation from the state thus held in response to the selection. Thereby, one obtains a correct number of output pulses from the SQUID sensor in correspondence to the magnitude of the unknown magnetic flux even when the SQUID magnetometer is switched during the measurement.

Other objects and further features of the present invention will become apparent from the following detailed description when read in conjunction with attached drawings.

DETAILED DESCRIPTION

Figure 3:
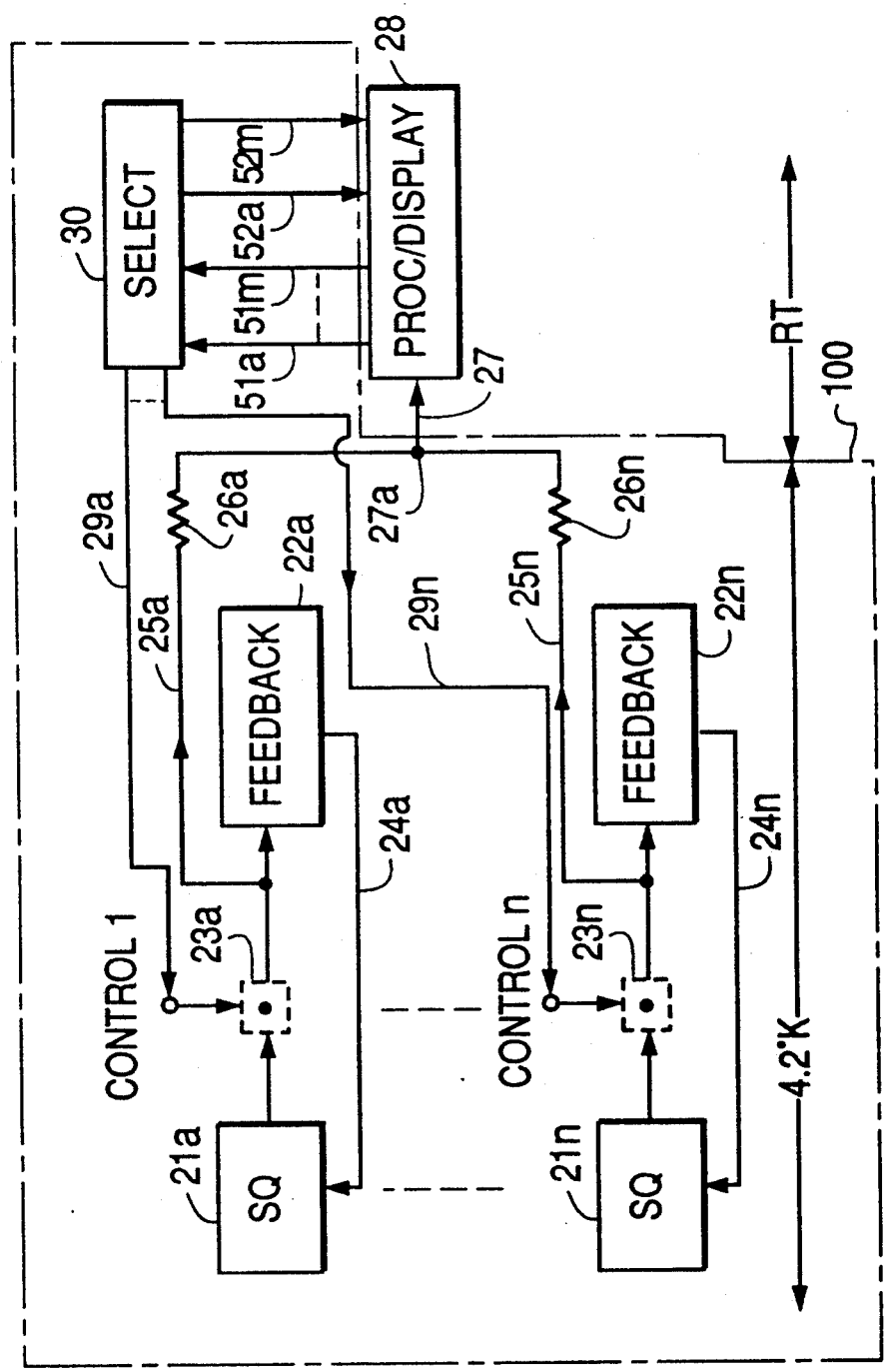
FIG. 3 is a block diagram showing the construction of a multi-channel SQUID magnetometer according to a first embodiment of the present invention.

FIG. 3 shows the block diagram of the first embodiment apparatus of the present invention.

Figure 1:
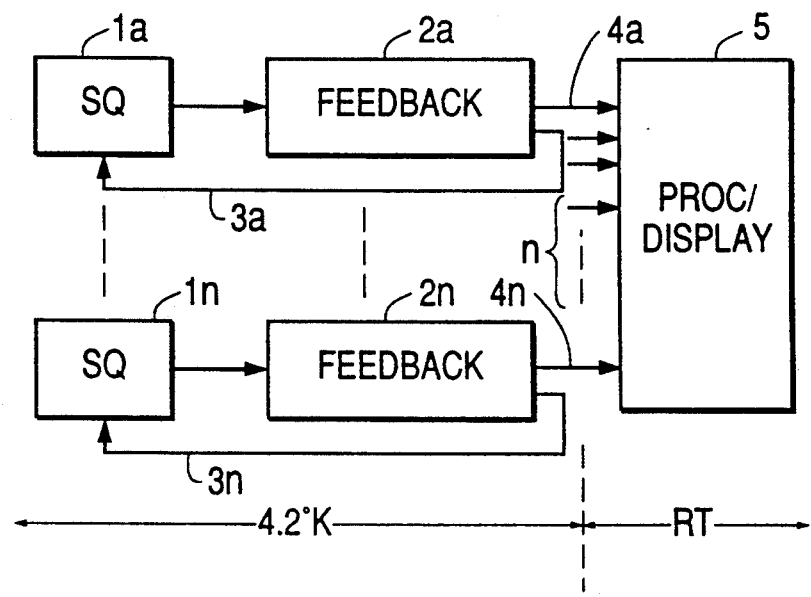
FIG. 1 is a block diagram showing a conventional SQUID multi-channel magnetometer using a number of SQUID sensors and feedback circuits provided in parallel.
Figure 2:
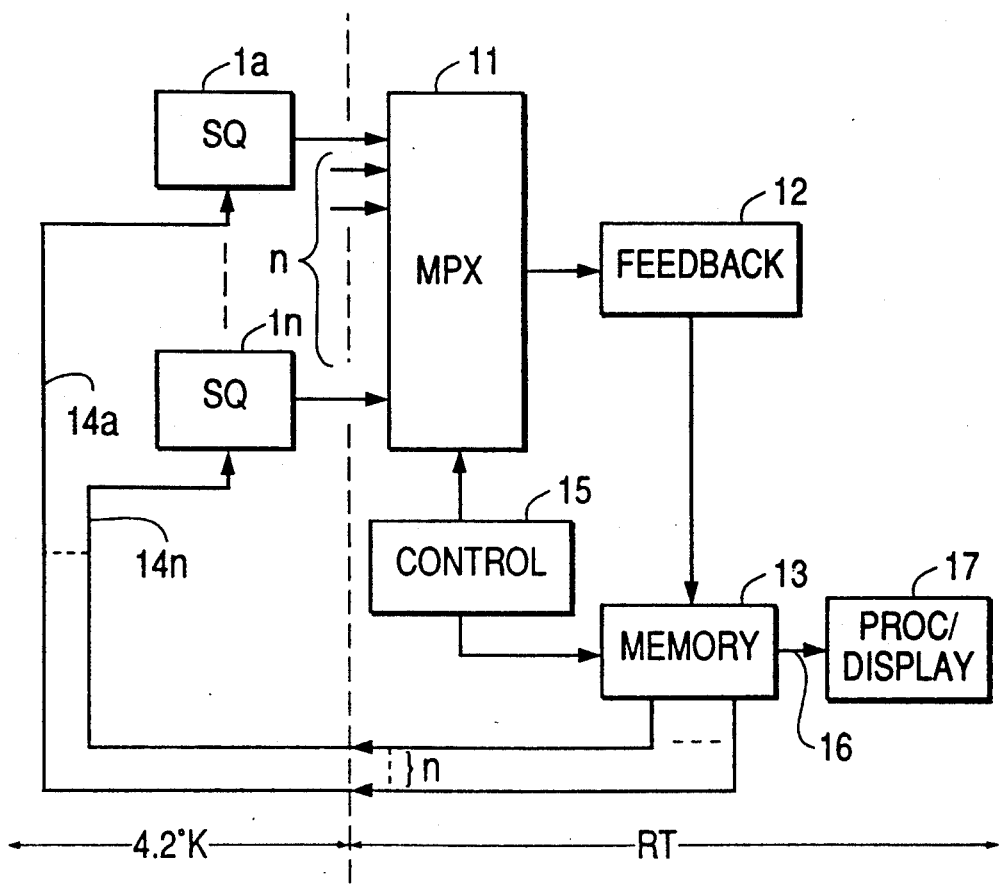
FIG. 2 is a block diagram showing the construction of another conventional multi-channel SQUID magnetometer using a multiplexer.

Referring to FIG. 3, the multi-channel SQUID magnetometer of the present invention comprises a number of digital SQUID sensors 21a–21n and corresponding feedback circuits 22a–22n, wherein each digital SQUID sensor is connected to a corresponding feedback circuit by a corresponding feedback path such as the feedback paths 24a–24n. Thereby, the SQUID sensor such as the SQUID 21a detects an unknown magnetic field and produces an output voltage pulse similar to the output pulse of the conventional digital SQUID of FIG. 1. This output pulse of the SQUID 21a is supplied to the feedback circuit 22a wherein the feedback circuit produces a feedback current that changes the magnitude in response to each output pulse of the SQUID sensor 21a. This feedback current is fed back to the SQUID sensor 21a via a feedback path 24a for producing a magnetic field that counteracts against the incident unknown magnetic flux. The SQUID sensor 21a continues producing the output pulses until the unknown magnetic flux is entirely canceled by the feedback magnetic flux that is induced by the feedback current. Thereby, the number of the output pulses thus produced by the SQUID sensor 21a represents the intensity of the unknown magnetic flux and the polarity of the output pulses indicates the direction of the magnetic flux. The operation so far described is known and identical to the case of each SQUID magnetometer of FIG. 1.

In the multi-channel SQUID magnetometer of FIG. 3, such SQUID sensors 21a–21n and feedback circuits 22a–22n cooperating with the corresponding SQUID sensors are arranged in parallel in correspondence to the plurality of channels, wherein the output of each SQUID magnetometer is collected at a node 27a via respective output lines 25a–25n. In the example of FIG. 3, the output lines 25a–25n are fanned in at the node 27a via respective resistors 26a–26n.

In the construction of FIG. 3, there are provided a number of control gates 23a–23n between the SQUID sensors 21a–21h and the feedback circuits 22a–22n. Each of the control gates 23a–23n is supplied with a control signal to be described later and passes the output pulses of the SQUID sensor selectively to the feedback circuit in response to the logic state of the control signal. For example, the control gate 23a is provided between the SQUID sensor 21a and the feedback circuit 22a and selectively allows passage of the output pulses of the SQUID sensor 21a to the feedback circuit 22a in response to the logic state of a control signal CONTROL1. Similarly, an n-th control gate 23n is provided between the n-th SQUID sensor 21n and the corresponding feedback circuit 23n and controls the passage of the output voltage pulses of the SQUID sensor 21n in response to the logic level of the control signal CONTROLn. It should be noted that all the SQUID sensors 21a–21h, the feedback circuits 22a–22n and the control gates 23a–23n, including the feedback paths 24a–24n and the output lines 25a–25n, are provided inside a low temperature vessel 100 filled with liquid helium for maintaining the SQUID sensors and the feedback circuits in the superconducting state.

Further, there is provided a selection circuit 30 also in the low temperature vessel 100 for producing the control signals CONTROL1–CONTROLn. Thus, the selection circuit 30 is connected to each of the control gates 23a–23n by n control lines 29a–29n. This selection circuit in turn produces the control signals CONTROL1–CONTROLn in response to selection signals that are given thereto from a processing and display unit 28 provided outside of the low temperature vessel 100, via selection control lines 51a–51m. The processing and display unit 28 is supplied with the output of the SQUID sensors 21a–21n via the node 27a and the line 27 connected thereto and converts the number of output pulses into the intensity of the magnetic field. The unit 28 further identifies the direction of the unknown magnetic flux based upon the polarity of the output voltage pulses and displays the direction and intensity of the unknown magnetic flux on a display screen or other suitable display device. Further, the processing and display unit 28 produces the foregoing selection signals and outputs the same on the selection control lines 51a–51n.

In operation, the processing and display unit 28 selects one of the channels by producing the selection signals. In response to the selection signals, one of the control gates such as the gate 23a is activated while other control gates are all set in the inactivated state. Thereby, only the output voltage pulses from the SQUID sensor 21a is supplied to the feedback circuit 22a and the feedback circuit 22a changes the magnitude of the counteracting magnetic flux stepwise in response to each output voltage pulse of the SQUID sensor 21a. On the other hand, the other, non-selected SQUID sensors such as the SQUID sensor 21n also produce the output pulses as long as there is a interlinking unknown magnetic flux. However, the output pulses of these non-selected SQUID sensors are blocked at the control gates such as the gate 23a and prohibited from arriving at the corresponding feedback circuits such as the feedback circuit 22n. Thereby, there is no output pulses supplied from the non-selected channels to the node 27a and thus to the processing and display unit 28. Only the output pulse from the selected channel is allowed to arrive at the unit 28. Further, the feedback circuits cooperating with the non-selected SQUID sensors are deprived of incoming pulses and thus, the feedback magnetic field that counteracts against the unknown magnetic flux is unchanged during the interval when the SQUID sensor is not selected. Because of this, the state of the SQUID magnetometers in the channels that are not selected does not change during this non-selection interval and the SQUID magnetometers resume the previous operation whenever selected in the next time.

It should be noted that the number of selection control lines 51a–51m can be substantially smaller than the number of channels, as the selection circuit 30 produces the control signals as a combination of the selection signals. Thereby, the penetration of heat into the low temperature vessel 100 through the selection control lines does not cause a serious problem. This point will be examined later in relation to the construction of the selection circuit 30.

Figure 4:
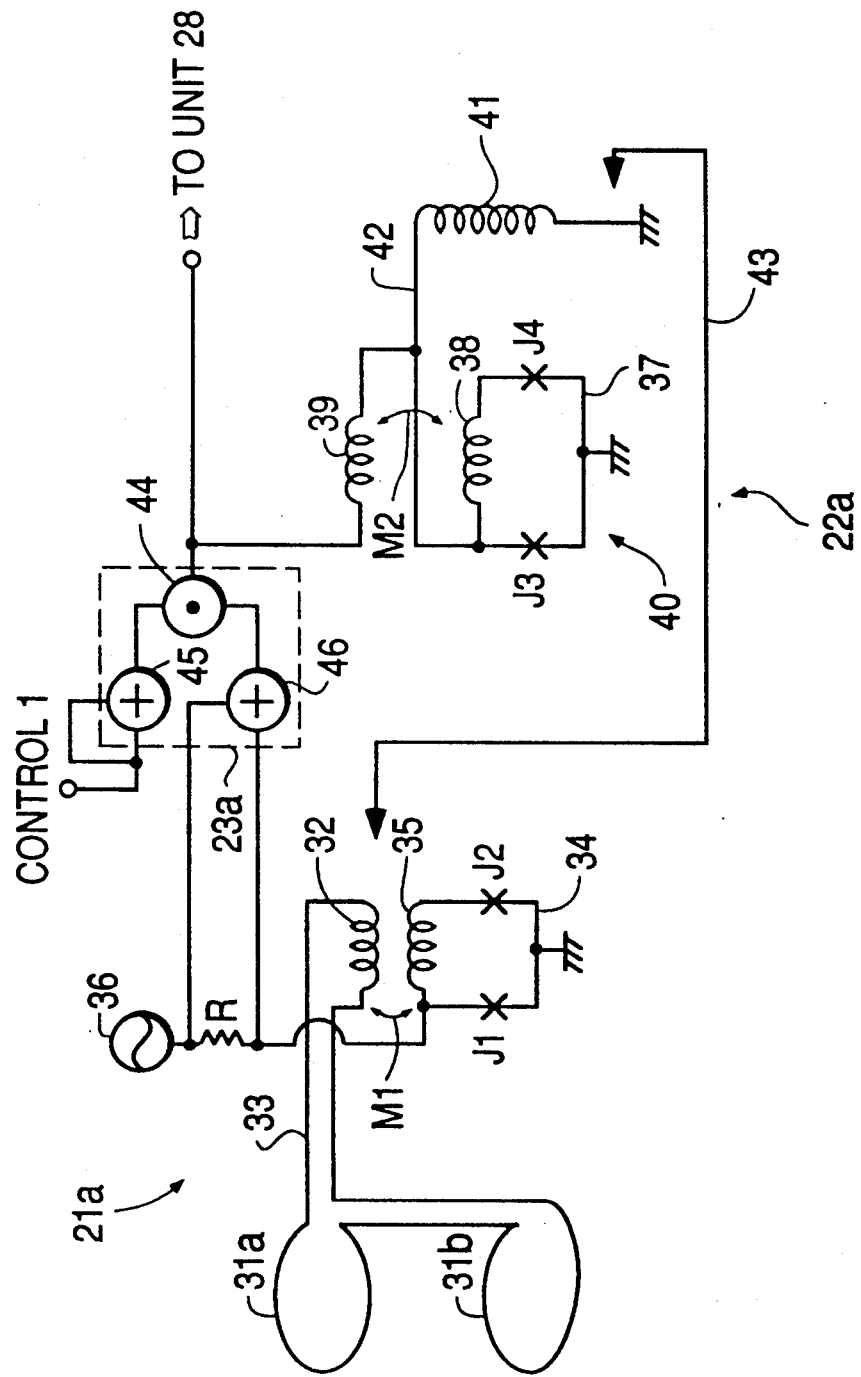
FIG. 4 is a circuit diagram showing the essential part of the multi-channel SQUID magnetometer of FIG. 3.

FIG. 4 shows in detail the construction of the SQUID sensor 21a and the cooperating feedback circuit 22a, together with the construction of the control gate 23a.

Referring to FIG. 4, the SQUID sensor 21a comprises a closed superconducting detection loop 33 including therein superconducting detection coils 31a and 31b for interlinking with the unknown magnetic flux, and another superconducting coupling coil 32 for magnetic coupling with a superconducting SQUID interferometer 34. The superconducting SQUID interferometer comprises a superconducting coupling coil 35 coupled magnetically to the superconducting coupling coil 32 and a pair of Josephson junctions J1 and J2 that shunt both ends of the coil 35 to a superconducting ground plane. Thereby, there is formed a closed loop forming the SQUID interferometer 34 by the coil 35, the Josephson junction J1, the ground plane, and the Josephson junction J2. Further, the SQUID interferometer 34 is supplied with an a.c. drive current from an a.c. voltage source 36 at a node connecting the Josephson junction J1 and the superconducting coil 35.

In operation, the Josephson junctions J1 and J2 are supplied with the a.c. drive current from the a.c. voltage source 36 as described previously. At the beginning, the Josephson junctions J1 and J2 are in a zero-voltage state characterized by zero-resistance. The magnitude of this a.c. drive current is set slightly smaller than a threshold level above which the Josephson junctions J1 and J2 causes a transition from the zero-voltage state to a finite voltage state characterized by a finite resistance.

When there is an unknown magnetic flux interlinking with the detection coils 31a and 31b of the detection loop 33, an induction current flows through the loop 33. This induction current in turn induces a second induction current in the SQUID interferometer loop 34. Thereby, the amount of current flowing through the loop 34 exceeds the threshold level of the zero-voltage state-to-finite voltage state transition of the Josephson junctions J1 and J2 in response to the peak level of the a.c. drive current. Thus, the Josephson junctions J1 and J2 experience the transition to the finite voltage state and the SQUID sensor 21a produces a train of pulses in response to the peak level of the a.c. drive current as long as the unknown magnetic flux interlinking with the detection loop 33.

This output pulse of the SQUID sensor 21a is then supplied to the control gate 23a, and from there, supplied further to the processing and display unit 28 on the one hand and to the feedback circuit 22a on the other hand. As can be seen in FIG. 4, the control gate 23a comprises a Josephson OR gate 45 supplied with the control signal CONTROL1 and latching the same for a period of high level state of the signal CONTROL1, another, a.c. biased Josephson OR gate 46 supplied with the output voltage pulse of the SQUID sensor 21a and latching the same during the active period of the a.c. basing, and a Josephson AND gate 44 that produces a logic product of the output of the OR gate 45 and the output of the OR gate 46. In other words, the output voltage pulse of the SQUID sensor 21a is supplied to the feedback circuit 22a and the processing and display unit 28 only when the logic level of the CONTROL1 is high.

It should be noted that the Josephson OR gate 45 is enabled by the control signal CONTROL1 given thereto as a bias separately to the input control signal CONTROL1, and resetted in response to the low level thereof. Further, the Josephson OR gate 46 is enabled by the a.c. drive current given thereto from the a.c. voltage source 36 and latches the output pulse supplied thereto in synchronization with the a.c. drive current. The operation of these Josephson OR gates will be described later with reference to FIG. 8A.

The feedback circuit 22a, on the other hand, is supplied with the output voltage pulse from the control gate 23a via a superconducting coil 39. This superconducting coil 39 is connected on the one hand to a SQUID interferometer comprising a superconducting coil 38 coupled magnetically to the coil 39 and Josephson junctions J3 and J4 that shunt both ends of the coil 38 to the superconducting ground plane, and on the other hand to a first end of another superconducting coil 41. The second end of the coil 41 is connected to the ground plane. More specifically, the superconducting coil 39 is connected to a node where the Josephson junction J3 and the superconducting coil 38 are connected with each other, and the Josephson junction J3 causes a momentary transition to the voltage state in response to the leading edge of the output pulse of the SQUID sensor 21a and returns to the original zero-voltage state immediately. In response to this transition of the Josephson junction J3, a magnetic flux associated with the current of the output voltage pulse enters into the SQUID interferometer loop 37 and trapped therein as a flux quantum in response to the returning of the Josephson junction J1 to the zero-voltage state.

In response to the falling edge of the output voltage pulse, on the other hand, the Josephson junction J4 causes a momentary transition to the finite voltage state and returns immediately to the zero-voltage state. Upon transition to the finite voltage state, the trapped flux quantum is transferred from the loop 37 to the superconducting coil 41. Thereby, an induction current flow through the coil 41 and the Josephson junction J4 returns to the zero-voltage state. After this, the induction current flows through the superconducting coil 41 as a persisting feedback current and induces a magnetic flux in the coil 41 as a stored magnetic flux. The magnitude of this stored magnetic flux changes stepwise in response to each output voltage pulse of the SQUID sensor 21a because of the quantization of the magnetic flux in the SQUID interferometer loops 37 and 41. The coil 41 is coupled magnetically to the coil 32 via a feedback loop 43 that schematically represents the magnetic coupling between the coil 41 and the superconducting detection loop 33 and the magnetic flux is thus fed back to the detection loop 33. The magnetic flux thus fed back counteracts against the unknown magnetic flux and reduce the net intensity of the magnetic flux that is detected by the detection loop 33. Therefore, the magnitude of the detected magnetic flux is decreased stepwise in response to each output pulse of the SQUID sensor 21a until the unknown magnetic flux is totally canceled out. By counting the number of the output pulses thus produced, one can determine the intensity of the magnetic field. On the other hand, the direction or polarity of the magnetic field is detected based upon the polarity of the output voltage pulses.

As already noted, the supplying of the output voltage pulses to the feedback circuit 22a is controlled by the control gate 23a in response to the control signal CONTROL1. Thus, when the control gate 23a is in the inactivated state and the passage of the output voltage pulses to the feedback circuit 22a blocked, the output pulses are also prevented from reaching the processing and display unit 28 in spite of the fact that the SQUID sensor 21a continues to produce the output pulses. Thus, during the non-selected period, the unit 28 does not count up the output voltage pulses produced by the SQUID sensors of the non-selected channels. Further, when the channel 21a is not selected, the magnetic flux stored in the superconducting coil 41 remains unchanged. This means that the state of the SQUID magnetometer does not change during the non-selected interval and that the SQUID magnetometer of each channel resumes its operation whenever reselected by the control signal.

FIGS. 5A-5D show the operational principle of the selection circuit 30. The selection circuit 30 comprises a number of circuit parts Q1-Qn each connected parallel to the selection control lines 51a-51m for receiving the selection signals therefrom.

Figure 5A:
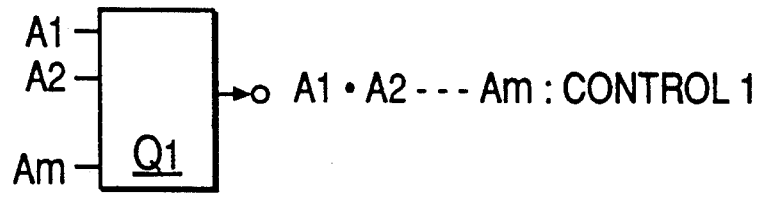
FIGS. 5A-5D are diagrams showing the logic operation performed in the multi-channel SQUID magnetometer for selecting a particular channel.

Referring to FIG. 5A showing the first part Q1 of the selection circuit 30, the circuit part Q1 is supplied with binary input selection signals A1, A2, ..., Am, from the selection control lines 51a-51m and produces a logic product $A1 \cap A2 \cap \ldots \cap Am$ addressing the first channel as the control signal CONTROL 1.

Figure 5B:
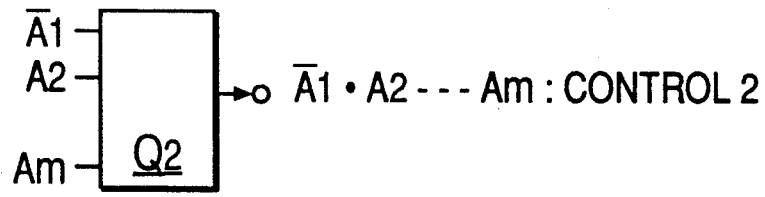
Figure 5C:
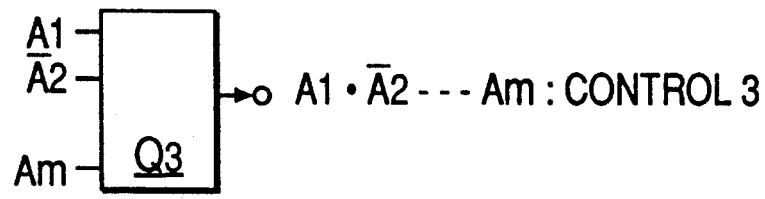
Figure 5D:
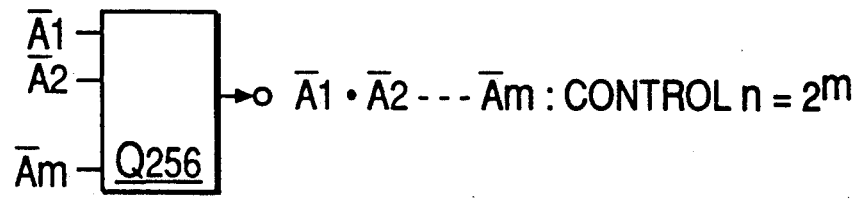

Similarly, the second part Q2 of the selection circuit is supplied with the input selection signals /A1, A2, ..., Am, via the selection control lines and produces a control signal CONTROL2 as a logic product $/A1 \cap A2 \cap \ldots \cap Am$ addressing the second channel as shown in FIG. 5B. Similarly, control signals CONTROL3-CONTROLn are produced as shown in FIGS. 5C and 5D.

Here, it should be noted that the number of the control signals, CONTROL 1-CONTROLn, is given by the combination of the logic state of the m selection signals A1-Am. In other words, the number of the control signals each corresponding to a channel is given as $2^m$ that is much larger than the number m. In other words, the number of the selection control lines 51a-51m used in the present construction can be much smaller than the number of the channels in the low temperature vessel 100. Thereby, the penetration of heat into the liquid helium in the vessel 100 through the selection control line is minimized. For example, only 8 such selection control lines are sufficient for addressing the 256 channels in the low temperature vessel 100. Compare this with the conventional case where 256 lines have been used for the connection between the channels in the vessel 100 and the control and display unit. Even when another 8 lines 52a-52m are provided in connection between the selection circuit 30 and the processing/display unit 28 in correspondence to the lines 51a-51m as in the case of the following example, such an increase does not cause any serious problem with regard to the penetration of heat through the conductor.

Figure 6:
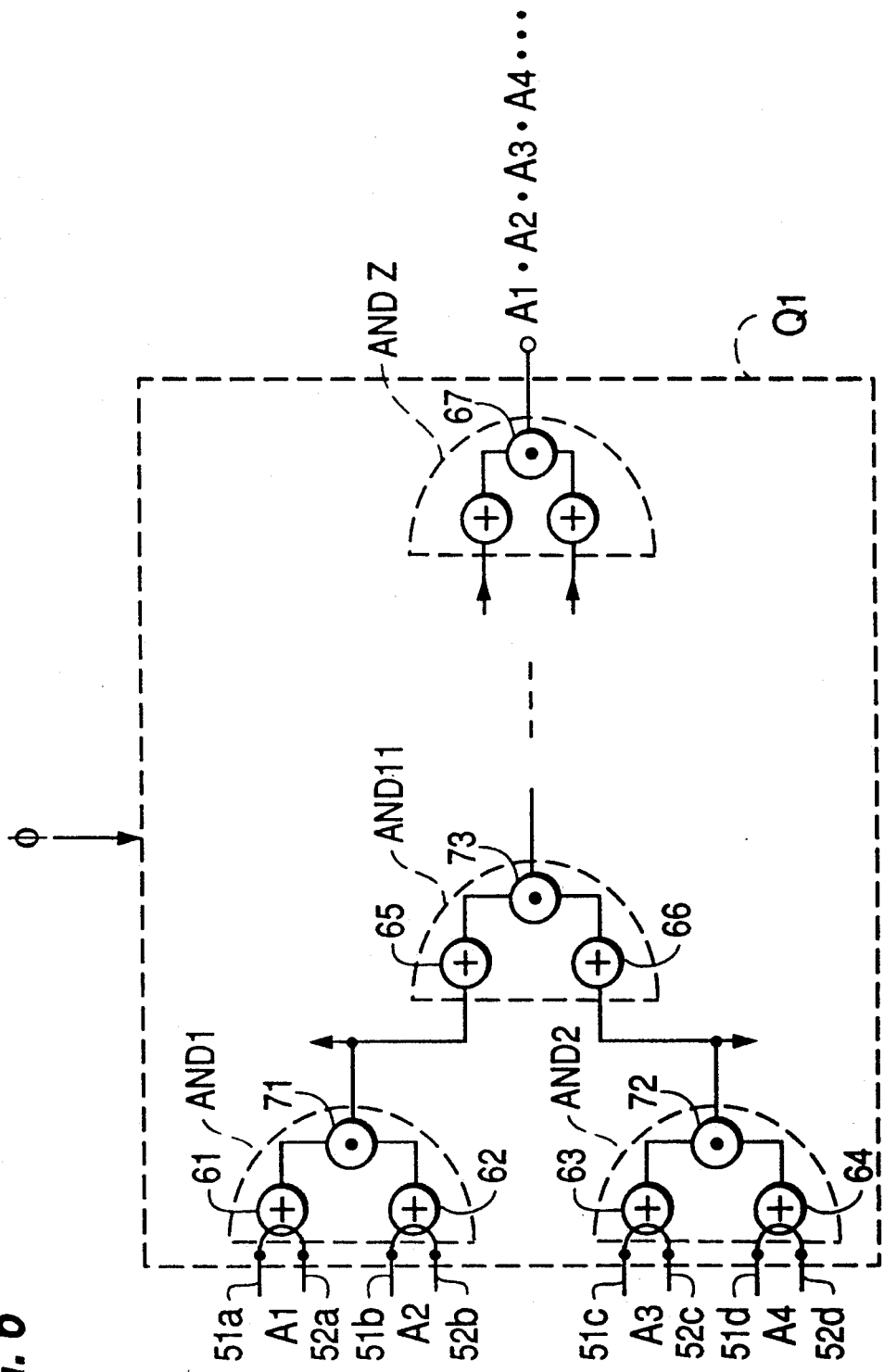
FIG. 6 is a circuit diagram showing the construction of a selection circuit used in the multi-channel SQUID magnetometer of FIG. 3.

FIG. 6 shows the detailed construction of the circuit part Q1 of FIG. 5A.

Referring to FIG. 6, there are provided a number of Josephson OR gates 61, 62, 63, 64, ... coupled magnetically to the selection control lines. For example, the lines 51a and 52a connected in series and forming an inductance therebetween are coupled to the gate 61. In practice, the lines 51a and 52a may be a single superconducting strip turned over in correspondence to the gate 61 where the coupling inductance is formed. Similarly, the lines 51b and 52b are coupled magnetically to a Josephson OR gate 62, the lines 51c and 52c are coupled magnetically to a Josephson OR gate 63, the lines 51d and 52d are coupled magnetically to a Josephson OR gate 64, and the like. Further, the OR gates are driven by a bias current $\phi$ given by the unit 28, and latches the selection control signals A1-A4 thus supplied thereto during the active period thereof. The bias current $\phi$ resets periodically to reset the Josephson OR gate at each clock.

The Josephson OR gates 61 and 62 are connected to a Josephson AND gate 71 to form a logic AND gate AND1 that produces an ordinary logic product of the input selection signals A1 and A2 respectively supplied via the line pair 51a and 52a and the line pair 51b and 52b. Similarly, the Josephson OR gates 63 and 64 are connected to a Josephson AND gate 72 to form a logic AND gate AND2 that produces an ordinary logic product of the input selection signals A3 and A4. The AND1 gate and AND2 gate are connected to a next stage logic product gate AND11 that comprises a Josephson OR gate 65 receiving the output from the AND1, a Josephson OR 66 receiving the output from the AND2, and a Josephson AND gate 73 receiving the outputs of the Josephson OR gates 65 and 66. In the circuit part Q1, such an arrangement of the Josephson OR and AND gates to form the logic AND gate is repeated for other selection signals A5-Am, and these logic AND gates are arranged into a number of stages. Thereby, there is a last stage gate ANDz that produces the logic product of all the selection signals A1, A2, ..., Am. The same construction can be applicable to the other circuit parts Q2-Qm. It should be noted that, in the case of the Josephson logic circuits, the input logic data is given in the form of true data and complementary data. Thus, the logic inversion of the data such as /A1, ... is always available. Of course, one may replace the Josephson OR gate that receives the inverted selection signal by a Josephson timed inverter of which construction will be described later.

The foregoing construction of magnetic coupling is preferable as the connection of the selection control lines 51a-51m, 52a-52m is achieved by the serial fan-out which reduces the number of fan-outs. For example, the selection control line 51a may be used in common by the Josephson OR gates in the circuit parts Q1-Qm. Thereby, the designing of the connection of the selection control lines is simplified.

Figure 7:
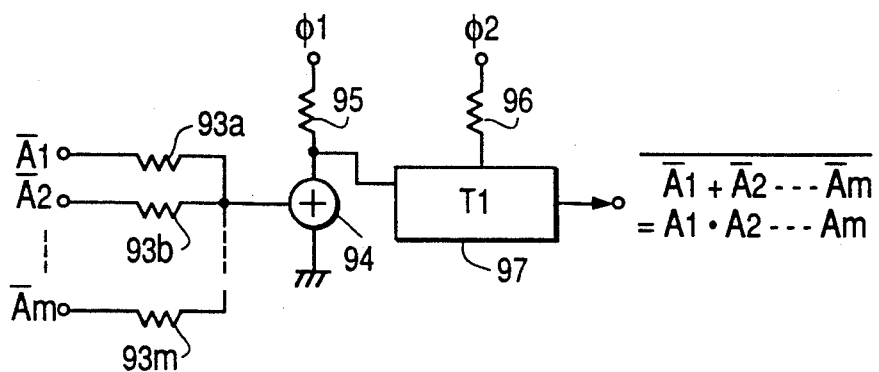
FIG. 7 is a circuit diagram showing another example of the construction of the selection circuit.

FIG. 7 shows an alternative construction of the circuit part Q1, wherein the logic inversion of the selection signals /A1, /A2, ..., /Am are supplied to a Josephson OR gate 94 via respective resistors 93a-93m. The Josephson OR gate in turn is operated in response to the first phase signal $\phi 1$ of the three-phase bias signals $\phi 1$, $\phi 2$ and $\phi 3$ or of the two-phase bias signals $\phi 1$ and $\phi 2$, and latches the logic sum of the supplied signals during the positive interval of the clock $\phi 1$. The sum held at the Josephson OR gate 94 is then transferred to a timed inverted 97 that is driven in response to the second phase clock $\phi 2$, and the timed inverter 97 outputs the logic inversion of the logic sum of the input signals /A1-/Am. Thereby, a logic product A1∩A2∩ ... ∩Am is obtained at the output of the timed inverter 97 as a result of the well known logic rule. When using this circuit for the circuit part other than the part Q1, the input signal or signals are suitably inverted by providing another timed inverter in the input side. The modification for this is obvious and further description thereof will be omitted. Usually, the true logic data and complementary logic data are available in the case of the Josephson logic circuits as already described.

Figure 8A:
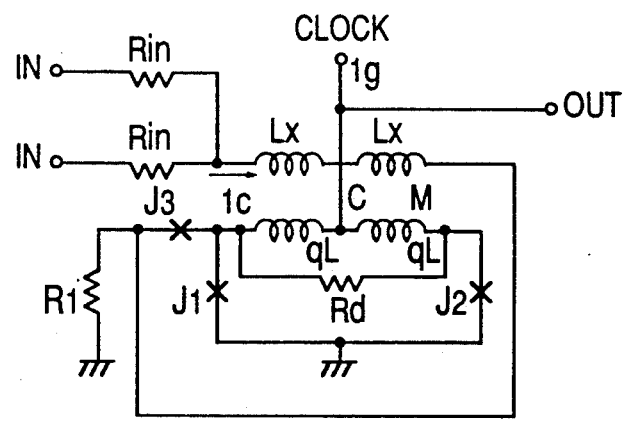
FIGS. 8A-8C are circuit diagrams showing the construction of Josephson logic elements used in the selection circuit of FIG. 6.
Figure 8C:
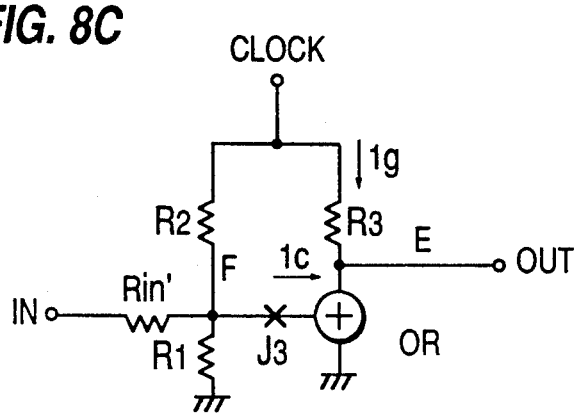
Figure 8B:
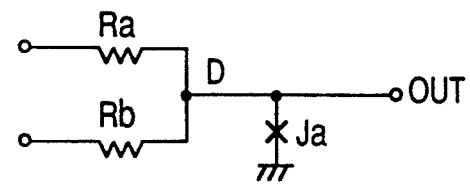

FIGS. 8A-8C are circuit diagrams of the Josephson OR gate, Josephson AND gate and the Josephson timed inverter used in the previous circuits, wherein these diagrams show a Josephson logic gates described previously by Fujimaki et al., "Josephson Modified Variable Threshold Logic Gates for Use in Ultra-High-Speed LSI," IEEE Transactions on Electron Devices Vol. 36, No. 2, February 1989, which is incorporated herein as reference. In these circuits, It should be noted that a known construction of direct coupling is employed instead of the magnetic coupling construction described with reference to the OR gates 61-64.

The OR gate of FIG. 8A forms an asymmetric SQUID interferometer and includes therein Josephson junctions J1 and J2, wherein the Josephson junction J1 has a critical current pIm while the Josephson junction J2 has a critical current qIm. Here, there holds a relationship $p+q=1$. Further, there is included an inductance L that is divided into a left branch having an inductance qL (referred to hereinafter as "inductance qL") and a right branch having an inductance pL (referred to hereinafter as "inductance pL"), wherein the branch qL has an end connected to the ground via the Josephson junction J1, and the branch pL has an end connected to the ground via the Josephson junction J2. The other end of the branch qL and the other end of the branch pL are connected each other at a central node C, to which the bias is supplied as a bias current Ig. Further, there are provided an inductance Lx to establish a magnetic coupling with the branches qL and pL via a mutual inductance M. The inductance Lx has an end connected to one or more input terminals for receiving an input current Ic and another end connected via a third Josephson junction J3 to the inductance qL at the end that is connected to the ground via the Josephson junction J1.

In operation, the Josephson junction J1-J3 are all in the zero voltage state in the initial state wherein the level of the bias is set at zero. Thereby, the bias current Ig flow to the ground directly with increased level of the bias and there appears a low or zero-voltage output at an output terminal OUT connected to the node C. The Josephson junctions J1-J3 remain in the turned on state as long as there is no input current Ic even when the bias has turned to the high level state.

When the current flowing through the Josephson junctions J1 and J2 has exceeded a predetermined threshold as a result of increase in the input current Ic, on the other hand, the Josephson junctions J1 and J2 cause a transition to the turned-off state. Thereby, the bias current Ig starts to flow through the Josephson junction J3 to the ground, after flowing through a resister Ri, and in response to this, the Josephson junction J3 is turned off. As a result, a high output is obtained at the output terminal. Obviously, the transition of the state of the output is caused in response to the sum of the input current at the input terminal IN, and thus, the circuit of FIG. 5A operates as a logic sum or OR-circuit. More detailed analysis of the circuit of FIG. 5A can be found in the foregoing reference by Fujimaki et al. In the circuit of FIG. 6, the input signals are given by the magnetic coupling of the selection control lines with the inductance Lx.

FIG. 8B shows the construction of the Josephson AND gate. Referring to FIG. 8B, the AND gate comprises a node D where the input signals are merged via respective resistances Ra and Rb, and a Josephson junction Ja that shunts the node D. The Josephson junction Ja is designed to have a threshold current of transition from the zero-voltage state to the finite voltage state such that the transition occurs only when there are input currents at both input terminals IN. Thereby, the circuit produces a logic product of the input logic signals. More complete description of this circuit can be found in the foregoing Fujimaki reference.

FIG. 8C shows the timed inverter used in the preceding circuits. The timed inverter comprises a Josephson OR gate driven by the clock current Ig in response to the signal CLOCK that is supplied to the OR gate via a resistor Rs and resetted periodically by the low level state of the clock. Further, the bias is voltage-divided by resistors R1 and R2 and supplied to the OR gate via a Josephson junction Js from a node F that is formed at a junction between the resistor R1 and the resistor R2. Further, an input signal is supplied to the OR gate via the node F. For this purpose, an input terminal IN is connected to the node F via a resistor Rin'.

In operation, when the current flowing form the node F to the OR gate is below a critical current level Ic in response to the no-input current state at the input terminal IN, the current supplied to the OR gate in response to the clock signal maintains the output of the OR gate at a high level state. On the other hand, when there is an input current at the input terminal IN, the current supplied from the node F to the OR gate exceeds the critical current Ic and the Josephson junction Js is turned off in response thereto. Thereby, the input current to the OR gate disappears and the output of the OR gate, obtained at a node E between the OR gate and the resistor Rs, changes to the low level state. Thus, an inversion of the input logic signal is obtained at an output terminal OUT connected to the node E.

Figure 9:
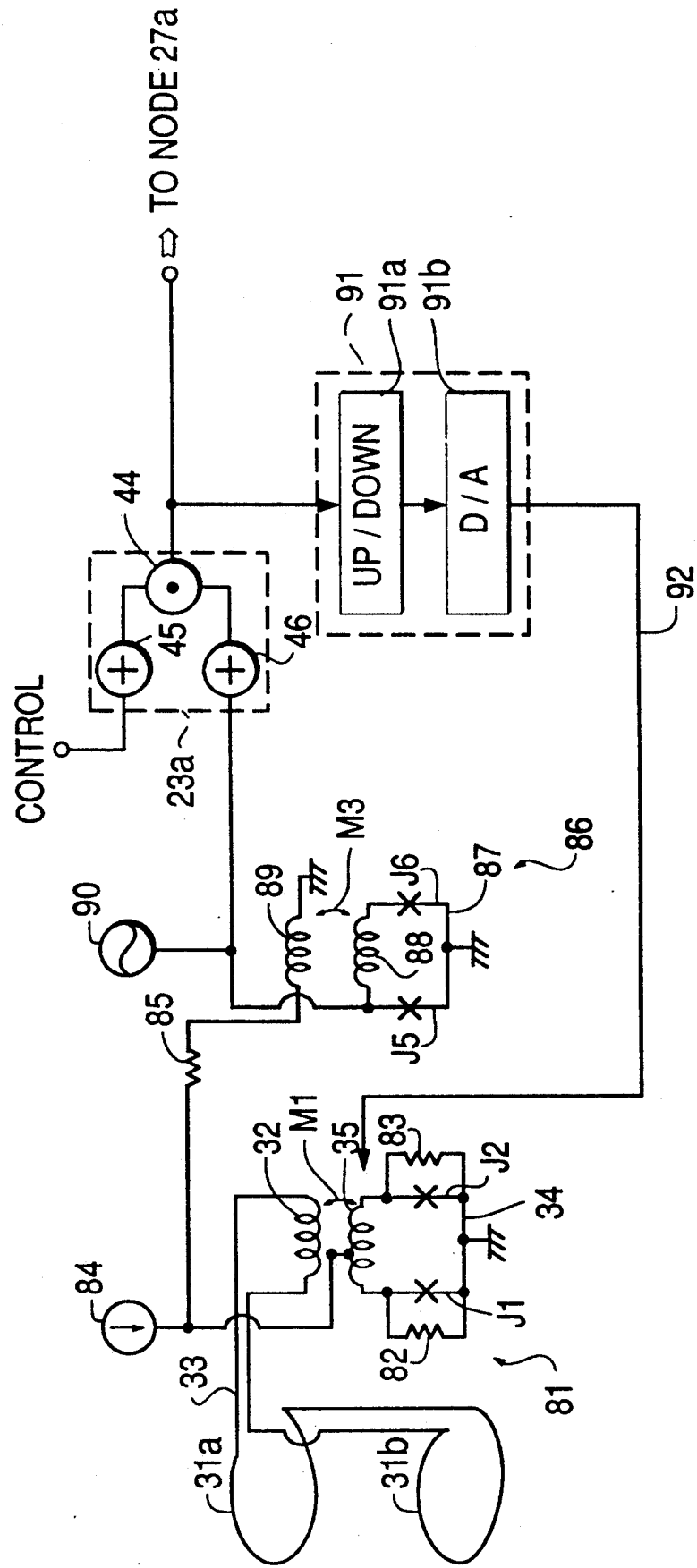
FIG. 9 is a circuit diagram showing a second embodiment of the present invention.

Next, a second embodiment of the present invention will be described with reference to FIG. 9. It should be noted that this drawing shows only one SQUID magnetometer or channel magnetometer used in the multichannel SQUID magnetometer similar to the case of FIG. 4. In FIG. 9, those parts that correspond to the parts described previously with reference to FIG. 4 are given identical reference numerals and the description thereof will be omitted.

Referring to the drawing, the channel magnetometer uses a so-called d.c. SQUID sensor 81 coupled magnetically to the superconducting detection loop 33 and a SQUID comparator 86. The d.c. SQUID sensor 81 comprises a superconducting coil 35 coupled magnetically to the superconducting coil 32 of the loop 32, and a pair of Josephson junctions J1 and J2 that shunt the both ends of the coil 35 to the superconducting ground plane. Thereby, there is formed a SQUID interferometer 34 by the coil 35, Josephson junctions J1 and J2, and the ground plane. Further, a d.c. drive current is supplied from a d.c. voltage source 84 to the Josephson junctions J1 and J2 via a midpoint in the coil 35.

In operation, when there is an unknown magnetic flux interlinking the coils 31a and 31b of the detection loop 33, the induction current in the detection loop 33 induces an induction current in the SQUID interferometer loop 34. In the loop 34, the Josephson junctions J1 and J2 are biased by the d.c. voltage source to cause the transition of the Josephson junctions to the voltage state at the threshold that in turn is changed in response to the induction current. In response to this, a voltage proportional to the magnitude of the induction current in the loop 34 is formed across the resistors 82 and 83 connnected parallel to the Josephson junctions J1 and J 2. This voltage is then supplied to the SQUID comparator 86 of the next stage via a resistor 85.

The SQUID comparator 86 comprises a superconducting coil 89 connected to the resistor 85 for receiving the output voltage from the d.c. SQUID sensor 81, another superconducting coil 88 coupled magnetically to the coil 89 and forming a SQUID interferometer 87 together with Josephson junctions J5 and J6 shunting the both ends of the coil 88 to the ground plane. The interferometer 87 is driven in response to an a.c. drive signal supplied from an a.c. voltage source 90 and forms an output voltage pulse in response to each cycle of the a.c. drive signal similarly to the case of the digital SQUID sensor 21a of FIG. 4 during the interval in which the output voltage is supplied from the d.c. SQUID sensor 81.

The output voltage pulses thus produced are then supplied to a superconducting digital feedback circuit 91 that comprises a superconducting up/down counter 91a and a superconducting D/A converter 91b of which construction is disclosed in the U.S. Pat. No. 4,947,118. In the superconducting up/down counter, the number of the output pulses are counted up together with their polarity, and the total number of positive output pulses are subtracted by the total number of negative output pulses. The data representing the difference thus produced indicates the magnitude of the feedback magnetic flux to be fed back to the detection loop, and this output data is converted to an analog signal that represents the magnitude of the feedback current used for producing the feedback magnetic flux.

This feedback magnetic flux thus produced in turn is coupled magnetically to the superconducting detection loop 33 as schematically shown by a line 92 representing the magnetic coupling, and there is induced a counteracting, feedback magnetic flux in the loop 33. Similarly to the first embodiment, the magnitude of the feedback magnetic flux is changed stepwise in response to each output pulse of the SQUID comparator 86 until the unknown magnetic flux is canceled out entirely. Similar to the first embodiment, the measurement of the strength of the unknown magnetic field is achieved by counting up the number of output voltage pulses thus produced and the detection of the direction of the magnetic flux is achieved by detecting the polarity of the output voltage pulses.

In constructing the multi-channel magnetometer, a number of circuits shown in FIG. 9 are arranged parallel as already shown and described in relation to FIG. 3. Thereby, each channel is addressed by the selection circuit 30. As this part of the construction is identical with the previous embodiment, the description thereof will be omitted.

Figure 10:
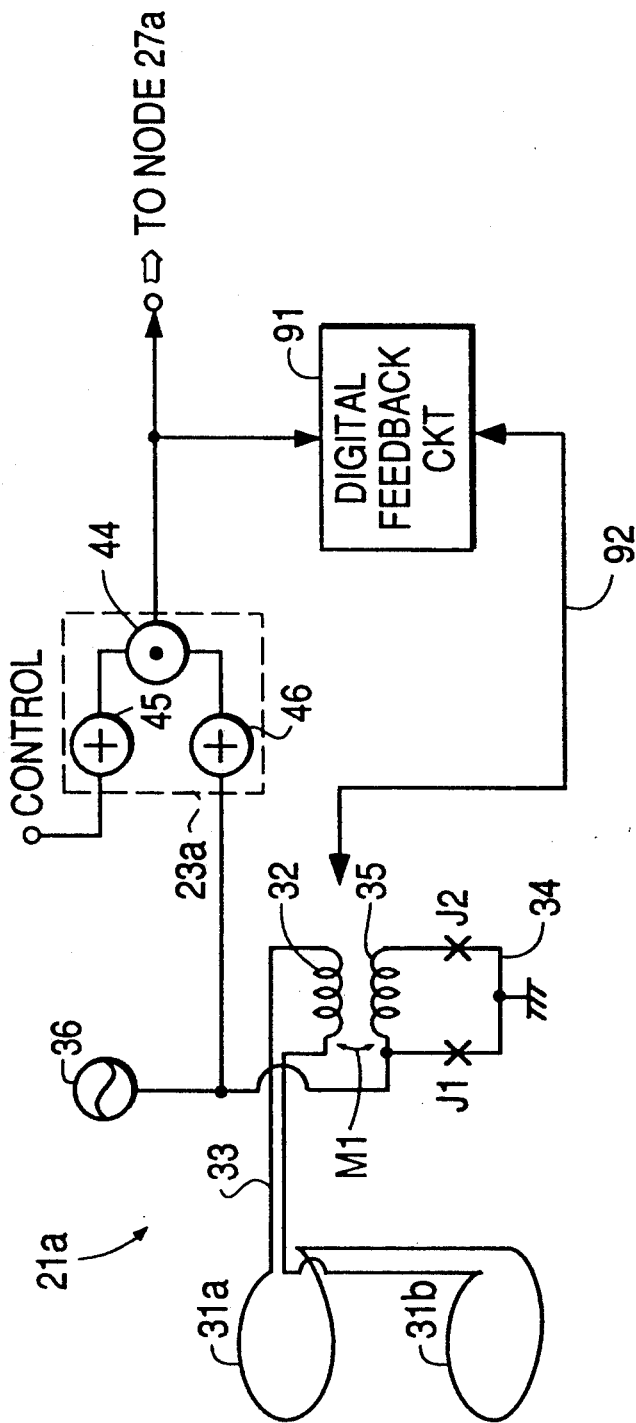
FIG. 10 is a circuit diagram showing a third embodiment of the present invention.

FIG. 10 shows a third embodiment, wherein the digital SQUID sensor 21a of FIG. 4 is combined with the superconducting digital feedback loop 91 of FIG. 9. Of course, the up/down counter and the D/A converter may be provided outside of the low temperature vessel 100. However, this is not preferable as such as construction increases the number of lines connecting the SQUID magnetometers in the vessel 100 to the circuits outside of the vessel 100 and thus increases the penetration of heat into the liquid helium. The same argument holds true also for the selection circuit 30. Thus, one may provide the selection circuit 30 outside the low temperature vessel 100. However, such a construction is not preferable because of the excessive penetration of heat and hence the consumption of the liquid helium.

Figure 11:
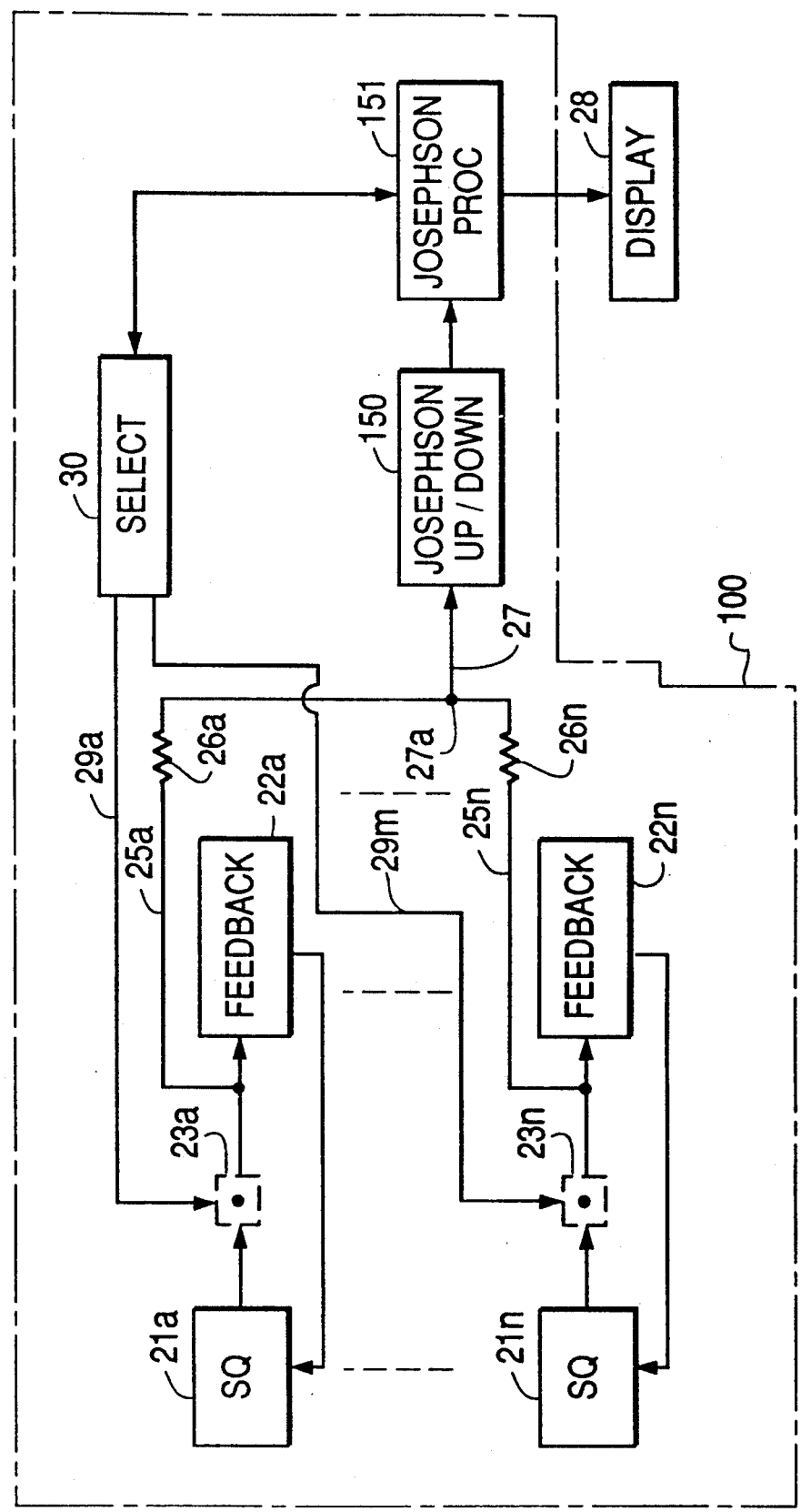
FIG. 11 is a block diagram showing a fourth embodiment of the present invention.

FIG. 11 shows a fourth embodiment of the present invention. In this embodiment, a Josephson up/down counter 150 is provided within the low temperature vessel 100 for receiving the output voltage pulses via the output line 27. Further, there may be another Josephson processor 151 also in the low temperature vessel 100 for processing the output of the Josephson up/down counter 150. The processor 151 may perform various data processing such as the Fourier transformation, identification of the source of the unknown magnetic field, and the like. In this case, the unit 28 at the outside of the low temperature vessel 100 receives only the processed output and may be a simply display unit.

Further, the present invention is not limited to the embodiments described heretofore, but various variations and modifications may be made without departing from the scope of the invention.

What is claimed is:

1. A multi-channel superconducting quantum interference magnetometer for measuring an unknown magnetic flux, comprising:

a cooling vessel for holding a cooling medium;

a plurality of superconducting quantum interference magnetometers provided in correspondence with a plurality of channels, each of said superconducting quantum interference magnetometers being accommodated in said cooling vessel so as to be cooled by the cooling medium and comprising:

a superconducting detection loop of a closed loop of superconducting body for interlinking with the unknown magnetic flux, a superconducting magnetic sensor magnetically coupled to said superconducting detection loop and having an output port for producing an output voltage pulse at the output port in response to the interlinking of said superconducting detection loop with the unknown magnetic flux, gate means connected to said output port of said superconducting magnetic sensor and supplied with a control signal for gating the output voltage pulse produced form the superconducting magnetic sensor to produce a gated output voltage pulse in response to a logic level of the control signal, and feedback means for producing a feedback magnetic flux that counteracts the unknown magnetic flux in response to each gated output voltage pulse;

selection means provided in said cooling vessel so as to be cooled by the cooling medium for receiving selection signals from an external processing circuit provided outside of said cooling vessel, said selection signal specifying a desired channel and, said selection means selectively supplying the control signal to said gate means in said superconducting quantum interference magnetometer specified as the desired channel; and connection lead means for leading each gated output voltage pulse to the external processing circuit provided outside the cooling vessel.

2. A multi-channel superconducting quantum interference magnetometer as claimed in claim 1, in which said gate means comprises an AND gate having a first input terminal operatively coupled to receive the output voltage pulses from said superconducting magnetic sensor and a second input terminal operatively coupled to receive the control signal from said selection means for selectively passing the output voltage pulses to the connection lead means in response to the logic level of the control signal.

3. A multi-channel superconducting quantum interference magnetometer as claimed in claim 1, in which said gate means comprises a first Josephson OR circuit including Josephson junctions and having a first input terminal operatively coupled to said superconducting magnetic sensor to receive the output voltage pulse of said superconducting magnetic sensor and a second input terminal for receiving a bias current in synchronization with the output voltage pulses of the superconducting magnetic sensor, a second Josephson OR circuit including Josephson junctions and having a first input terminal operatively coupled to said selection means to receive said control signal and a second input terminal for receiving a bias current in synchronization with the control signal, and a Josephson AND circuit including a Josephson junction operatively coupled to said first and second Josephson OR circuits to receive the output voltage pulse and the control signal simultaneously from the first and second Josephson OR circuits for producing the gated output voltage pulse by causing a transition of the AND circuit to a logic high level state when both the output voltage pulse and the control signal have a logic high level state.

4. A multi-channel superconducting quantum interference magnetometer as claimed in claim 1, in which said selection means comprises a plurality of logic circuits, each of said logic circuits operatively coupled to said gate means to provide the control signal as a logic product of the selection signals.

5. A multi-channel superconducting quantum interference magnetometer as claimed in claim 4, in which each of said logic circuit receives the selection signal which include a combination of logic signals and corresponding inversion signals thereof, wherein each of said logic circuits receives a different combination of the logic signals and the corresponding inversion signals.

6. A multi-channel superconducting quantum interference magnetometer as claimed in claim 4, in which each of said logic circuits comprises a plurality of logic product gates operatively coupled to said gate means and arranged to produce the logic product of the selection signals.

7. A multi-channel superconducting quantum interference magnetometer as claimed in claim 6, in which each of said logic product gates comprises
- a plurality of Josephson OR circuits having respective input terminals for receiving the selection signals from the external processing circuit said Josephson OR circuit latching the selection signal supplied thereto and producing a latched output, and
- a Josephson AND gate having a second AND gate Josephson junction and operatively coupled to the Josephson OR circuits for producing a high level output in response to a transition of the second AND gate Josephson junction only when each of the outputs of the Josephson OR circuit has a high level state.

8. A multi-channel superconducting quantum interference magnetometer as claimed in claim 7, in which each of said Josephson OR circuits receives the selection signals over a conductor magnetically coupled with the external processing circuit.

9. A multi-channel superconducting quantum interference magnetometer as claimed in claim 4, in which each of said logic circuits comprise
- a Josephson OR circuit for receiving the selection signals from the external processing circuit and for latching a logic sum of the selection signals, and
- a Josephson timed-inverter operatively coupled to the Josephson OR circuit to receive the logic sum latched in said Josephson OR circuit for producing a logic inversion of the logic sum.

10. A multi-channel superconducting quantum interference magnetometer as claimed in claim 1 in which said feedback means comprises
- an up/down counter provided in the cooling vessel operatively coupled to said superconducting magnetic sensor to receive each output voltage pulse and produce output data indicative of a sum of the output pulses of a first polarity subtracted by a sum of the output pulses of a second, opposing polarity, and
- a digital-to-analog converter provided in the cooling vessel operatively coupled to the up/down counter to receive the output data and convert the output date to an analog signal.

11. A multi-channel superconducting quantum interference magnetometer as claimed in claim 1, in which said superconducting magnetic sensor comprises a superconducting quantum interference device driven by an a.c. bias and magnetically coupled to said superconducting detection loop.

12. A multi-channel superconducting quantum interference magnetometer as claimed in claim 1, in which said superconducting magnetic sensor comprises
- a first superconducting quantum interference device driven by a d.c. drive current, said first superconducting quantum interference device magnetically coupled to said superconducting detection loop to produce an output current generally proportional to the unknown magnetic flux, and
- a second superconducting quantum interference device driven by an a.c. bias and magnetically coupled to said first superconducting quantum interference device to produce the output voltage pulse in response to the a.c. bias and the output current of said first superconducting quantum interference device.

13. A multi-channel superconducting quantum interference magnetometer for measuring an unknown magnetic flux in one of a plurality of superconducting quantum interference magnetometers selected by a control signal, comprising:
- a plurality of superconducting detection loops each comprising a closed loop of a superconducting body for interlinking with the unknown magnetic flux,
- a plurality of superconducting magnetic sensors each being magnetically coupled to one of said superconducting detection loops for producing an output voltage pulse in response to the interlinking of said superconducting detection loop with the unknown magnetic flux,
- a plurality of gates, each coupled to one of said superconducting magnetic sensors and to receive the control signal, to gate the output voltage pulse from the superconducting magnetic sensor, each of said gates having an output port and producing a gated output voltage pulse at said output port in response to the control signal, and
- a plurality of feedback circuits each connected to the output port of one of said gates for receiving the gated output pulse therefrom and coupled to one of said superconducting detection loops that corresponds to said superconducting magnetic sensor that in turn corresponds to said gate for producing a feedback magnetic flux that counteracts the unknown magnetic flux in response to each gated output voltage pulse;
- said superconducting detection loop, said superconducting magnetic sensor, said gate and said feedback circuit being provided in a low temperature environment in which said superconducting body shows a superconductivity;
- selection means provided also in said low temperature environment for selecting one of said gates by selectively providing said control signal to a selected gate; and
- an output conductor connected commonly to the output port of each gate for conducting the output voltage pulse produced by said gates, said output conductor extending from the low temperature environment to an outer environment that exits outside said low temperature environment.

14. A multi-channel superconducting quantum interference magnetometer for measuring an unknown magnetic flux in one of a plurality of superconducting quantum interference magnetometers selected by a control signal, comprising:

a superconducting detection loop of a closed loop of a superconducting body for interlinking with the unknown magnetic flux, a superconducting magnetic sensor magnetically coupled to said superconducting detection loop for producing an output voltage pulse in response to the interlinking of said superconducting detection loop with the unknown magnetic flux, a gate, coupled to said superconducting magnetic sensor and to receive the control signal, to gate the output voltage pulse from the superconducting magnetic sensor to produce a gated output voltage pulse in response to the control signal, and a feedback circuit coupled to said gate and said superconducting magnetic sensor for producing a feedback magnetic flux that counteracts the unknown magnetic flux in response to each gated output voltage pulse, and wherein said gate comprises an AND gate having a first input terminal operatively coupled to receive the output voltate pulses from said superconducting magnetic sensor and a second input terminal for selectively passing the output voltage pulses in response to the control signal.

* * * * *

UNITED STATES PATENT AND TRADEMARK OFFICE
CERTIFICATE OF CORRECTION

PATENT NO. : 5,155,434
DATED : October 13, 1992
INVENTOR(S) : FUJIMAKI

It is certified that error appears in the above-identified patent and that said Letters Patent is hereby corrected as shown below:

On the title page: Item [54] and Column 1, line 3,

Change "SUPERCONDUCTING GUANTUM INTERFERENCE MAGNETOMETER HAVING A PLURALITY OF GATED CHANNELS" to --SUPERCONDUCTING QUANTUM INTERFERENCE MAGNETOMETER HAVING A PLURALITY OF GATED CHANNELS--.

Signed and Sealed this

Sixteenth Day of November, 1993

Attest:

BRUCE LEHMAN

Attesting Officer

Commissioner of Patents and Trademarks